United States Patent
Masui

(10) Patent No.: US 9,312,661 B2
(45) Date of Patent: Apr. 12, 2016

(54) NITRIDE SEMICONDUCTOR LASER ELEMENT

(71) Applicant: NICHIA CORPORATION, Kaminaka-cho, Anan-shi, Tokushima (JP)

(72) Inventor: Shingo Masui, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/692,385

(22) Filed: Apr. 21, 2015

(65) Prior Publication Data

US 2015/0229105 A1    Aug. 13, 2015

Related U.S. Application Data

(63) Continuation of application No. 14/089,508, filed on Nov. 25, 2013, now Pat. No. 9,124,071.

(30) Foreign Application Priority Data

Nov. 27, 2012  (JP) ................................. 2012-259129
Nov. 25, 2013  (JP) ................................. 2013-242961

(51) Int. Cl.
| | |
|---|---|
| *H01S 5/34* | (2006.01) |
| *H01S 5/20* | (2006.01) |
| *H01S 5/343* | (2006.01) |
| *B82Y 20/00* | (2011.01) |
| *H01S 5/02* | (2006.01) |

(Continued)

(52) U.S. Cl.
CPC . *H01S 5/34* (2013.01); *B82Y 20/00* (2013.01); *H01S 5/021* (2013.01); *H01S 5/0213* (2013.01);

(Continued)

(58) Field of Classification Search
CPC ....... H01S 5/34; H01S 5/2009; H01S 5/2031; H01S 5/34333; H01S 5/021; H01S 5/0213; H01S 5/3013; H01S 5/2018; H01S 5/3215; H01S 5/3202
See application file for complete search history.

(56) References Cited

U.S. PATENT DOCUMENTS

| | | | |
|---|---|---|---|
| 6,555,403 B1 | 4/2003 | Domen et al. | |
| 2005/0127391 A1* | 6/2005 | Yanamoto | ..................... 257/103 |

(Continued)

FOREIGN PATENT DOCUMENTS

| | | |
|---|---|---|
| EP | 1 670 106 A1 | 6/2006 |
| JP | 2001-065632 A | 3/2001 |

(Continued)

OTHER PUBLICATIONS

Extended European Search Report issued in corresponding Application No. 13194375.5, dated Dec. 4, 2015.

*Primary Examiner* — Armando Rodriguez
(74) *Attorney, Agent, or Firm* — Foley & Lardner LLP

(57) ABSTRACT

A nitride semiconductor laser element includes an n-type semiconductor layer, a p-type semiconductor layer, and an active layer between the n-type semiconductor layer and the p-type semiconductor layer. The active layer includes well layers, and at least one barrier layer provided between the well layers. The barrier layer includes a barrier layer having band gap energy higher than that of an n-side optical guide layer. The p-type semiconductor layer includes an electron barrier layer having band gap energy higher than that of all barrier layers comprised in the active layer. A p-side optical guide layer includes a first region disposed on a side of a final well layer and having band gap energy lower than that of the n-side optical guide layer, and a second region disposed on a side of the electron barrier layer and having band gap energy higher than that of the n-side optical guide layer.

8 Claims, 6 Drawing Sheets

(51) Int. Cl.
*H01S 5/30* (2006.01)
*H01S 5/32* (2006.01)

(52) U.S. Cl.
CPC ............ *H01S 5/2018* (2013.01); *H01S 5/2031* (2013.01); *H01S 5/3013* (2013.01); *H01S 5/34333* (2013.01); *H01S 5/2009* (2013.01); *H01S 5/3202* (2013.01)

(56) References Cited

U.S. PATENT DOCUMENTS

2007/0205424 A1* 9/2007 Kamikawa et al. ............. 257/94
2008/0247435 A1* 10/2008 Choi ........................ 372/46.01
2010/0189148 A1 7/2010 Kyono et al.
2011/0212560 A1 9/2011 Sumitomo et al.

FOREIGN PATENT DOCUMENTS

| JP | 2002-261393 A | 9/2002 |
| JP | 2002-270894 A | 9/2002 |
| JP | 2005-150568 A | 6/2005 |
| JP | 2005-209873 A | 8/2005 |
| JP | 2009-200437   | 9/2009 |
| JP | 2010-123920 A | 6/2010 |

* cited by examiner

NITRIDE SEMICONDUCTOR LASER ELEMENT

CROSS-REFERENCE TO RELATED APPLICATIONS

This application is a Continuation of U.S. patent application Ser. No. 14/089,508, filed Nov. 25, 2013, and claims priority to Japanese Patent Application Nos. 2012-259129 and 2013-242961, filed Nov. 27, 2012 and Nov. 25, 2013, respectively, the entire contents of which are incorporated by reference herein.

BACKGROUND OF THE INVENTION

1. Field of the Invention

The present invention relates to a nitride semiconductor laser element.

2. Description of Related Art

In recent years, it has become possible for a nitride semiconductor laser as a nitride semiconductor element to perform oscillation in a wide wavelength range from an ultraviolet region to green. Therefore, the nitride semiconductor laser is expected to be applied not only for a light source of optical disk systems but for a light source of a wide variety of devices. Especially, the nitride semiconductor laser for emitting a light in a range of a visible light region closer to a side of a long wavelength range than a violet-blue region is expected as a light source for displays such as a light source for projectors and a light source for televisions.

JP 2009-200437 A discloses a semiconductor laser. The semiconductor laser includes a substrate provided thereon with an n-type clad layer, a first optical guide layer, an active layer, a second optical guide layer, and a p-type clad layer, wherein the second optical guide layer includes an InGaN region of which In composition gradually decreases from a side of the active layer toward a side of the p-type clad layer.

However, the semiconductor laser having such structure as disclosed in JP 2009-200437 A may cause an increase in threshold current because of incomplete optical confinement into the active layer. Such semiconductor laser may also cause light leakage to an electron barrier layer that significantly absorbs light, resulting in worsening of laser characteristics. An n-side semiconductor layer includes a composition graded layer and such structure may cause a phenomenon in which a voltage increases. This problem can be avoided by doping with impurity, while impurity absorbs laser light. As a result, laser characteristics are lowered.

A semiconductor light emitting element in JP 2001-65632 A discloses a structure in which a region with low band energy and a region with high band energy exist in a p-side barrier layer. However, the p-side barrier layer does not function as an optical guide layer because of its small total thickness of 10 nm, leading to poor optical confinement, and thus laser characteristics may deteriorate. As a result, the semiconductor light emitting element employing the structure may cause a decrease in internal quantum efficiency.

In case the nitride semiconductor laser element has a quantum well structure including a well layer in an In-containing nitride layer, the In content must be increased as an oscillation wavelength becomes longer. As a result, large strain occurs inside the semiconductor layer, thus causing a decrease in internal quantum efficiency due to worsening of crystallinity and an increase in piezoelectric polarization. Thinning of the well layer can restrain the above-mentioned problem. However, carrier confinement to the well layer becomes inferior and overflow of the carrier occurs, leading to a decrease in internal quantum efficiency.

In a guide layer constituting a part of a waveguide included in a laminated structural body of the laser element, carrier concentration in regions other than the well layer increases due to an increase of overflow of the carrier from the well layer, thus causing light absorption, non-radiative recombination (Shockley Read-Hall (SRH) recombination, non-radiative Auger recombination) or a radiative recombination not contributing to oscillation. Whereby, worsening of laser characteristics, such as the above-mentioned decrease in internal quantum efficiency occurs.

In order to enhance carrier confinement, it is possible to suggest a structure in which an energy gap of a barrier layer is increased and a structure in which the thickness of a barrier layer is more increased. However, in this case, there may arise a problem that the barrier layer itself causes an increase in an operating voltage.

It is necessary for a laser element including an active layer between an upper clad layer and a lower clad layer to ensure refractive index difference for the confinement of light in the waveguide, including the active layer. Specifically, a nitride semiconductor having a large Al composition ratio is used for the clad layer, thus causing a problem of crystallinity. This is because crystallinity of a nitride semiconductor containing Al tends to cause deterioration due to the occurrence of cracks as compared with the other nitride semiconductors that do not contain Al.

SUMMARY OF THE INVENTION

The present invention has been made in view of the above-mentioned circumstances. Namely, an object of the present invention is to provide a nitride semiconductor laser element in which internal quantum efficiency is improved and also an operating voltage is lowered.

The above-mentioned problems can be solved by the present invention. The nitride semiconductor laser element thus provided includes an n-type semiconductor layer, a p-type semiconductor layer, and an active layer between the n-type semiconductor layer and the p-type semiconductor layer. The n-type semiconductor layer includes an n-side optical guide layer. The active layer includes two or more well layers, and at least one barrier layer provided between the well layers. The barrier layer includes a barrier layer having band gap energy higher than that of the n-side optical guide layer. The p-type semiconductor layer includes an electron barrier layer having band gap energy higher than that of all barrier layers included in the active layer. A p-side optical guide layer is provided between a final well layer and the electron barrier layer. The final well layer is a well layer nearest to the p-type semiconductor layer of the two or more well layers. The p-side optical guide layer includes: a first region that is disposed on a side of the final well layer and has band gap energy lower than that of the n-side optical guide layer; and a second region that is disposed on a side of the electron barrier layer and has band gap energy higher than that of the n-side optical guide layer.

According to an aspect of the nitride semiconductor laser element of the present invention, the internal quantum efficiency can be improved. According to another aspect of the nitride semiconductor laser element of the present invention, the nitride semiconductor laser element can work with a low operating voltage.

DETAILED DESCRIPTION OF THE EMBODIMENTS

Figure 1:
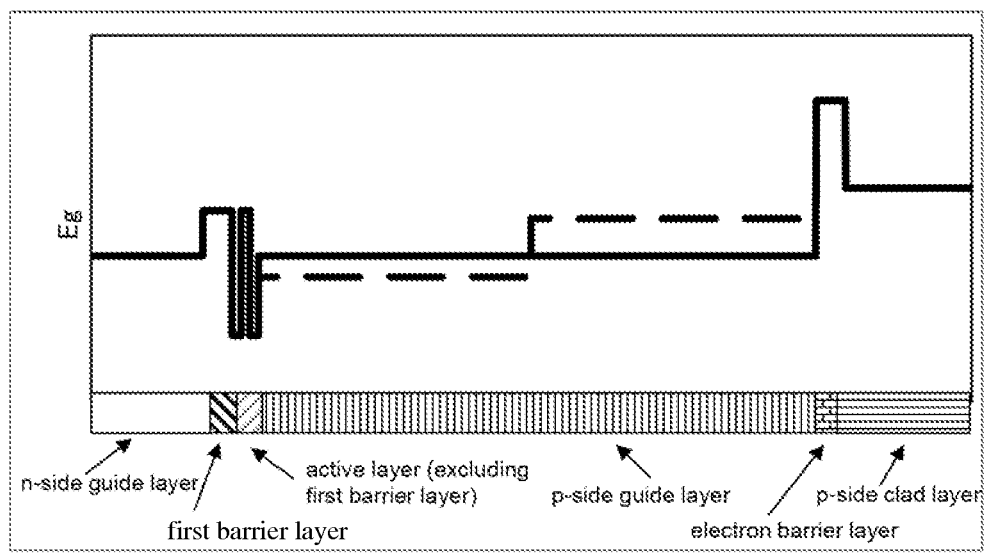
FIG. 1 is a schematic diagram illustrating a band energy image of a structure of a nitride semiconductor laser element according to an embodiment of the present invention and that of a conventional structure.

Mode for carrying out the present invention will be described below.

A nitride semiconductor laser element according to the embodiment of the present invention includes an n-type semiconductor layer, a p-type semiconductor layer, and an active layer between the n-type semiconductor layer and the p-type semiconductor layer; wherein the n-type semiconductor layer includes an n-side optical guide layer; wherein the active layer includes two or more well layers, and at least one barrier layer provided between the well layers; wherein the at least one barrier layer includes a barrier layer having band gap energy higher than that of the n-side optical guide layer; wherein the p-type semiconductor layer includes an electron barrier layer having band gap energy higher than that of all barrier layers included in the active layer; wherein a p-side optical guide layer is provided between a final well layer, that is a well layer nearest to the p-type semiconductor layer of the two or more well layers, and the electron barrier layer; and wherein the p-side optical guide layer includes: a first region that is disposed on a side of the final well layer and has band gap energy lower than that of the n-side optical guide layer, and a second region that is disposed on a side of the electron barrier layer and has band gap energy higher than that of the n-side optical guide layer.

The laser element employing such structure can decrease the concentration of electrons and holes of the p-side optical guide layer existing between the final well layer and the electron barrier layer. Therefore, probability of non-radiative recombination decreases, or probability of radiative recombination in the semiconductor layer not contributing to oscillation decreases, resulting in enhanced internal quantum efficiency. As a result, laser characteristics of the laser element are improved. Hereinafter, radiative recombination in the semiconductor layer not contributing to oscillation may sometimes be collectively referred to non-radiative recombination.

Mechanism thereof will be described in detail below.

Usually, injected electrons and holes are recombined and consumed in a semiconductor layer. The recombination of electrons and holes injected into the well layer is typically represented by the following model formula (1), where R denotes a recombination velocity.

$$R(n) = An + Bn2 + Cn3 \tag{1}$$

where n denotes a carrier concentration, A denotes a SRH non-radiative recombination coefficient, B denotes a radiative recombination coefficient, and C denotes an Auger recombination coefficient.

It is found from the model formula that the velocity of radiative recombination and that of non-radiative recombination, namely, probability of recombination depends on the carrier concentration. The recombination depending on the carrier concentration not only occurs in the well layer, but also occurs in every epitaxial layer. In other words, it is possible to assume that a decrease in carrier concentration of layers other than the well layer enables suppression of non-radiative recombination of the entire laser element, and also enables an improvement in internal quantum efficiency of the laser element.

The above description will be explained below by way of examples.

Figure 2:
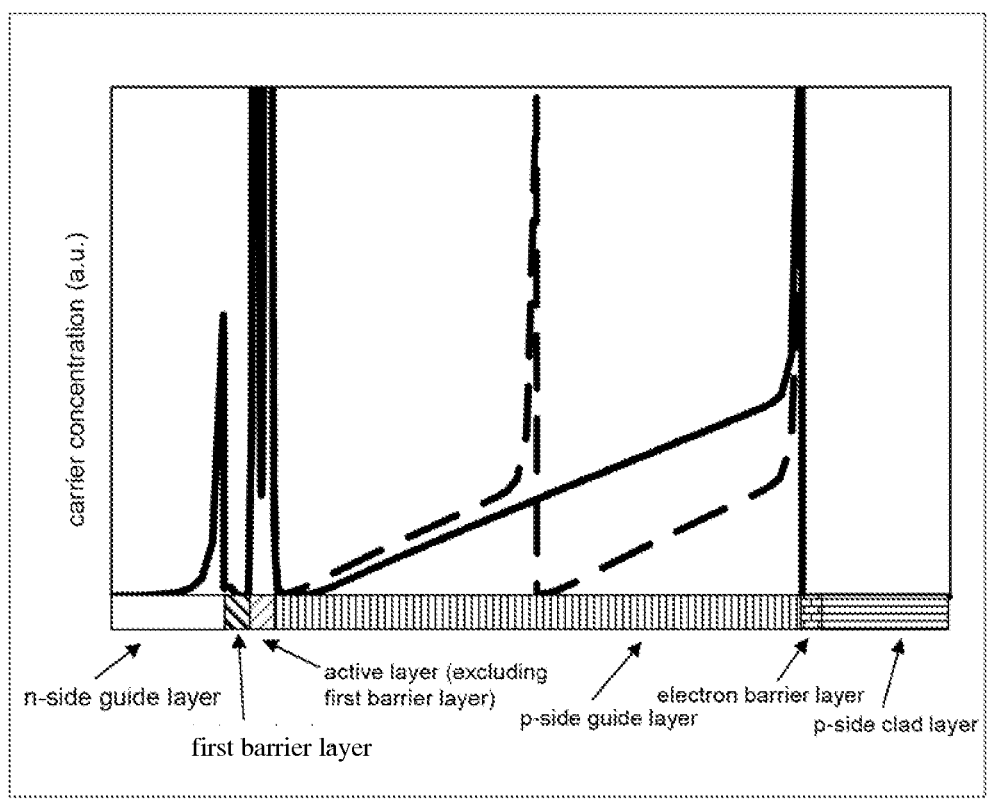
FIG. 2 is a schematic diagram illustrating carrier concentration distribution of a structure of a nitride semiconductor laser element according to an embodiment of the present invention and that of a conventional structure.

A schematic diagram of a band energy image, and a schematic diagram of carrier concentration distribution upon oscillation of a p-side optical guide layer calculated using band simulation (using LASTP manufactured by CROSSLIGHT Software Inc.) of a conventional structure are indicated by a solid line in FIG. 1 and FIG. 2, respectively. In models illustrated in FIG. 1 and FIG. 2, an n-side guide layer, a first barrier layer, an active layer (excluding a first barrier layer), a p-side optical guide layer, an electron barrier layer, and a p-side clad layer are disposed in this order from the left side of a horizontal axis. The band energy image illustrated in FIG. 1 illustrates a magnitude relation between band energy of each layer. The carrier concentration includes two different types such as electron concentration and hole concentration. It has been confirmed that both concentrations exhibit carrier concentration distributions of almost the same concentration in the p-side guide layer, so that only the electron concentration is illustrated as carrier concentration distribution for the sake of simple illustration. As is apparent from FIG. 2, the carrier concentration of the p-side optical guide layer (p-side guide layer) gradually increases from the active layer to the electron barrier layer. When the carrier concentration of the layers other than the two or more well layers (active layer) becomes higher, the probability of non-radiative recombination (SRH recombination and the Auger recombination) in the portion becomes higher. As a result, the probability of non-radiative recombination of the laser element becomes higher to cause a decrease in internal quantum efficiency. The probability of radiative recombination not contributing to oscillation in the layers other than the well layers also becomes higher to cause a decrease in internal quantum efficiency. As is apparent from the above description, it is considered that the carrier concentration of layers other than the well layers exerts significant influence on the probability of non-radiative recombination. Especially, the carrier concentration of more than $1 \times 10^{18}$ cm$^{-3}$ exerts more significant influence on internal quantum efficiency.

On the other hand, it has been found that formation of a region (first region) having band energy lower than that of the n-side guide layer and a region (second region) having band energy higher than that of the n-side guide layer on the p-side optical guide layer in this order from a side of the well layer (from a side of the active layer) decreases the carrier concentration of the p-side optical guide layer. This band image is indicated by a broken line in FIG. 1. Carrier concentration distribution is indicated by a broken line in FIG. 2. It is also found that the carrier concentration is nearly the same or increases as compared with the carrier concentration in a conventional structure in the region with low-band energy, while the carrier concentration significantly decreases as compared with the carrier concentration in a conventional structure in the region with high-band energy. In other words, it becomes apparent that the probability of non-radiative recombination in the p-side optical guide layer is significantly decreased. This structure is a structure of the laser element according to the present embodiment (broken line of FIG. 2). Namely, employment of the laser element structure of the present embodiment enables a remarkable decrease in electron concentration and hole concentration of the p-side optical guide layer between the final well layer and the electron barrier layer. Therefore, the probability of non-radiative recombination decreases, thus causing an increase in internal quantum efficiency.

It is possible to effectively decrease an operation voltage by providing the region with low band gap energy (first region) on the side of the final well layer of the p-side optical guide layer. This reason is considered that a gap of the band energy between the final well layer and the p-side optical guide layer becomes smaller, thus causing a decrease in operating voltage. On the other hand, since the carrier confinement to the well layer becomes inferior, overflow of electrons may be facilitated. However, the laser element is provided with the region with high band gap energy (second region) on a side of the electron barrier layer of the p-side optical guide layer, so that the second region can prevent electrons from overflowing and can effectively decrease the electron carrier concentration of a layer just before the electron barrier layer. As a result, it is possible to decrease the probability of non-radiative recombination of the semiconductor layer while decreasing the voltage, thus enabling an improvement in internal quantum efficiency.

Figure 3:
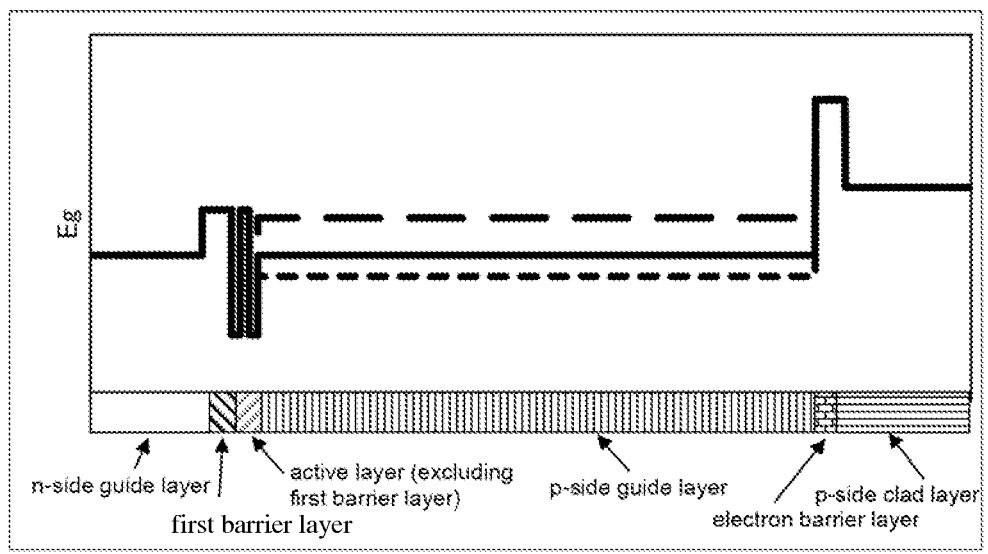
FIG. 3 is a schematic diagram illustrating a band energy image of a conventional structure of a nitride semiconductor laser element and that of Comparative Example.
Figure 4:
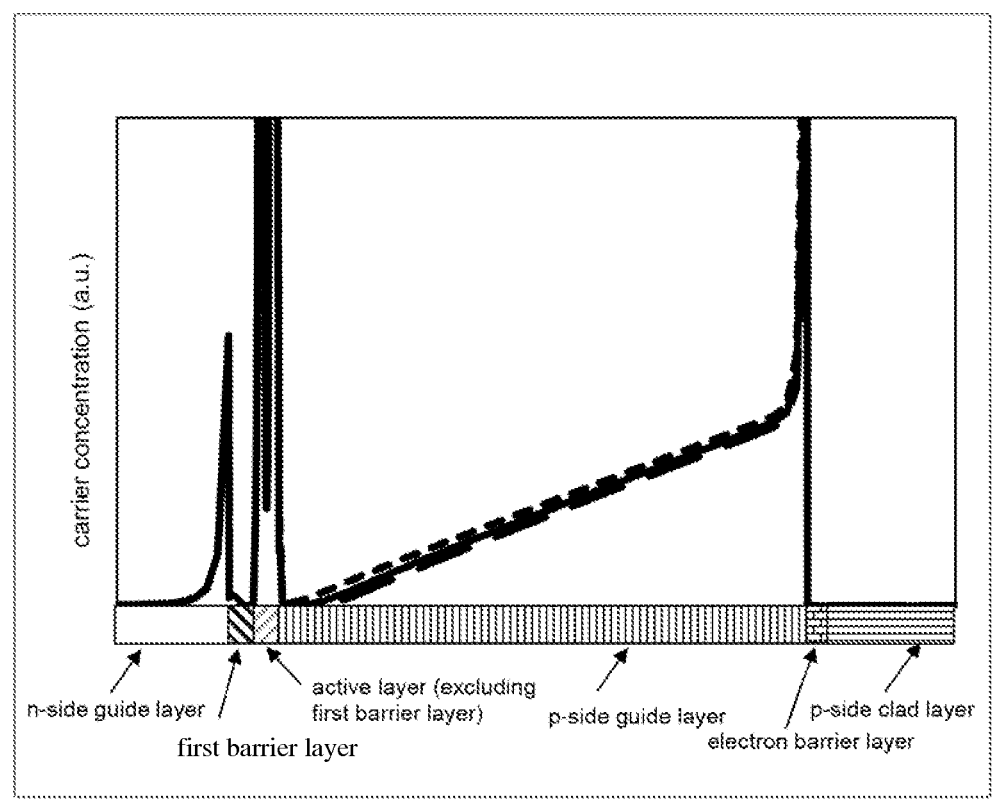
FIG. 4 is a schematic diagram illustrating carrier concentration distribution of a conventional structure of a nitride semiconductor laser element and that of Comparative Examples.

For comparison, a description will be made on a structure in which only the region with low band energy is provided on the p-side optical guide layer (Comparative Example 1) and a structure in which only the region with high band energy is provided on the p-side optical guide layer (Comparative Example 2). A schematic diagram of a band image thereof is illustrated in FIG. 3, together with a schematic diagram of a band image of a conventional structure. Similarly, a schematic diagram of carrier concentration distribution thereof is illustrated in FIG. 4, together with carrier concentration distribution of a conventional structure. In FIG. 3 and FIG. 4, a conventional structure is indicated by a solid line, a structure of Comparative Example 1 is indicated by a dotted line, and a structure of Comparative Example 2 is indicated by a broken line. In case the p-side optical guide layer is provided with only the region with low-band energy, the voltage increases as mentioned above. However, an increase in overflow of electrons causes an increase in carrier concentration of the p-side optical guide layer and thus internal quantum efficiency decreased as mentioned above. These data are plotted by a dotted line in FIG. 3 and a dotted line in FIG. 4

On the other hand, in case the p-side optical guide layer is provided with only the region with high band energy, the carrier concentration of the p-side optical guide layer slightly decreases and, therefore, slight increase in internal quantum efficiency is expected. However, the voltage increases due to barriers of the well layers and the p-side optical guide layer. These data are plotted by a broken line in FIG. 3 and a broken line in FIG. 4. At this time, the carrier concentration decreases very slightly as compared to the structure of the present invention, thus exerting little effect.

As for the semiconductor laser element, optical confinement to the well layers must be taken into consideration. The optical confinement to the well layers is determined depending on a refractive index difference of each layer and the refractive index tends to decrease for a material having larger band energy. If the p-side optical guide layer includes only a region having band energy larger than that of the n-side optical guide layer, light moves toward the n-side optical guide layer, so that the optical confinement to the well layers becomes inferior. On the other hand, if the p-side optical guide layer includes only a region having band energy smaller than that of the n-side optical guide layer, light moves toward the p-side optical guide layer, so that the optical confinement to the well layers also becomes inferior. Since the electron barrier layer and the p-type semiconductor layer have a large light absorption coefficient, if light leaks to the p-type semiconductor layer (p-type clad layer), light absorption becomes larger, resulting in deterioration of properties of the semiconductor laser. The nitride semiconductor laser element of the present embodiment can effectively perform optical confinement to the well layer by providing the p-side optical guide layer with the region having band energy lower than that of the n-side optical guide layer and the region having band energy higher than that of the n-side optical guide layer as compared with the n-side optical guide layer. The nitride semiconductor laser element can also minimize light leakage to the p-type semiconductor layer by providing the region with high-band energy, thus enabling an improvement in performance of the semiconductor laser.

Figure 11:
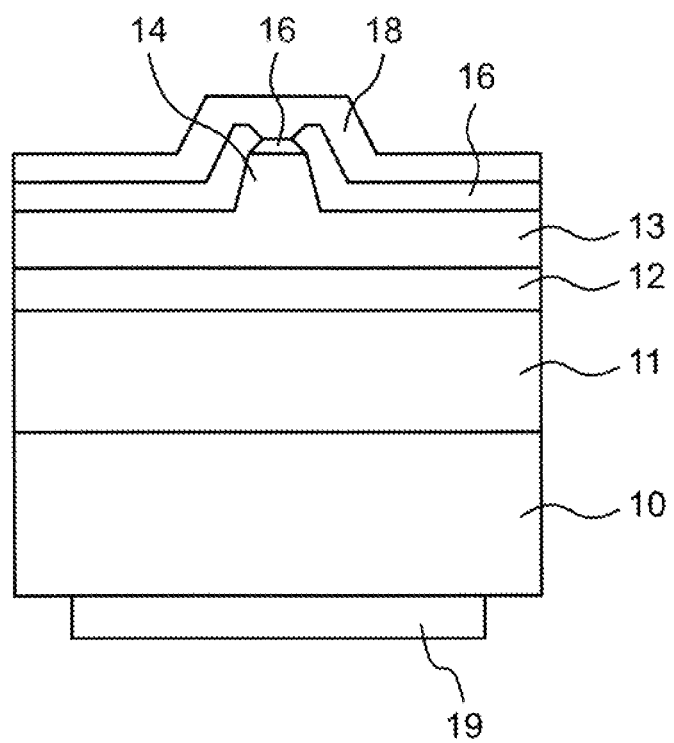
FIG. 11 is a schematic cross sectional view of a nitride semiconductor laser element according to an embodiment of the present invention.

FIG. 11 is a view schematically illustrating the configuration of a nitride semiconductor laser element according to the embodiment of the present invention. A nitride semiconductor laser element 100 includes a substrate 10 disposed thereon with an n-type semiconductor layer 11, an active layer 12, and a p-type semiconductor layer 13. These layers basically constitute a multi-layered structure. The structure of the nitride semiconductor laser element of the present invention is not limited to this drawing.

The n-type semiconductor layer 11 includes at least an n-side optical guide layer.

The active layer 12 in the present embodiment has a multi-quantum well structure, and includes two or more well layers and at least one barrier layer (one or more barrier layers) between the well layers. A well layer of the well layers nearest to the n-type semiconductor layer is a first well layer. A well layer of the well layers nearest to the p-type semiconductor layer is a final well layer. The at least one barrier layer (the one of more barrier layers) includes a barrier layer having band gap energy higher than that of the n-side optical guide layer.

The p-type semiconductor layer 13 includes an electron barrier layer having band gap energy higher than that of all barrier layers included in the active layer 12. The p-type semiconductor layer 13 further includes a p-side optical guide layer between the final well layer and the electron barrier layer. The p-side optical guide layer includes at a side of the final well layer a region having band gap energy lower than that of the n-side optical guide layer, and includes at a side of the electron barrier layer a region having band gap energy higher than that of the n-side optical guide layer.

The nitride semiconductor laser element according to the present embodiment may use GaN, AlN, or InN, or a mixed crystal thereof, that is, a group III-V nitride semiconductor ($In_\alpha Al_\beta Ga_{1-\alpha-\beta} N$, where $0 \le \alpha$, $0 \le \beta$, $\alpha+\beta \le 1$). In addition to the above, the nitride semiconductor laser element may also use a mixed crystal containing B as a group III element, or a mixed crystal in which N is partially substituted with P or As as a group V element. The nitride semiconductor containing Al satisfies the relation $\beta > 0$. The nitride semiconductor containing In satisfies the relation $\alpha > 0$.

The nitride semiconductor includes a layer containing impurities. Specifically, it is possible to use, as n-type impurity, group IV elements such as Si, Ge, Sn, S, O, Ti, and Zr, or group VI elements. Si, Ge, and Sn are preferably used. Examples of p-type impurity include Be, Zn, Mn, Cr, Mg and Ca. Mg is preferably used. Whereby, each conduction type semiconductor layer is formed.

Figure 5:
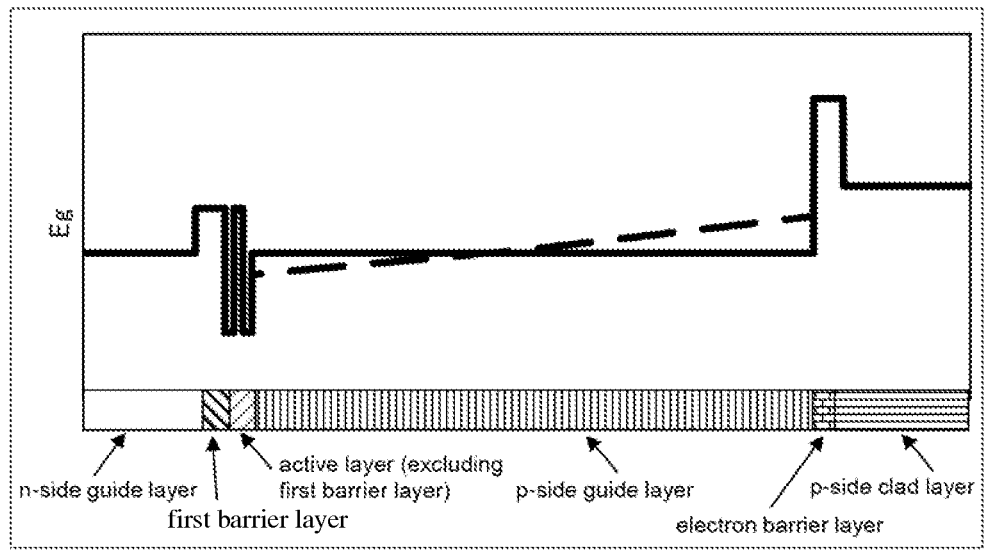
FIG. 5 is a schematic diagram illustrating a band energy image of a structure of a nitride semiconductor laser element according to an embodiment of the present invention and that of a conventional structure.
Figure 6:
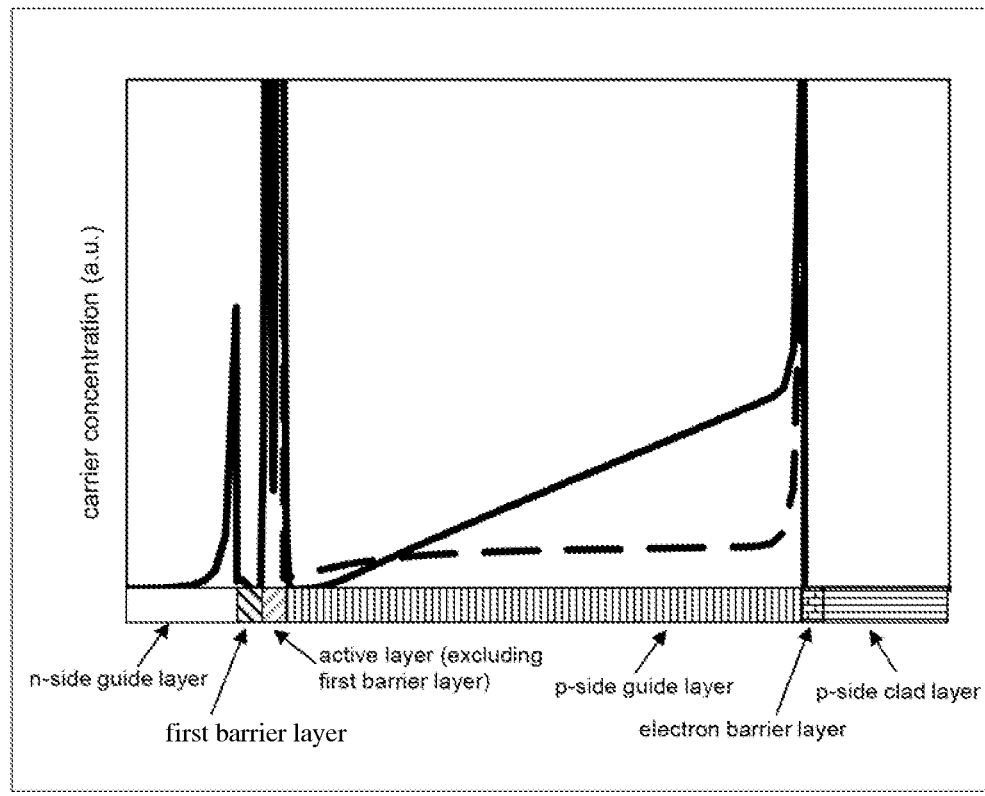
FIG. 6 is a schematic diagram illustrating carrier concentration distribution of a structure of a nitride semiconductor laser element according to an embodiment of the present invention and that of a conventional structure.

The p-side optical guide layer in the present embodiment may include a composition graded layer such that band energy increases approximately linearly from the side of the final well layer to the side of the electron barrier layer. A schematic diagram of a band energy image and a schematic diagram of carrier concentration distribution are illustrated in FIG. 5 and FIG. 6, respectively, together with those of a conventional structure. In FIG. 5 and FIG. 6, the conventional structure is indicated by a solid line and a structure of the present embodiment is indicated by a broken line. The configuration of the present embodiment indicated by the broken line can effectively decrease the carrier concentration in the p-side optical guide layer. In the composition graded layer, an increase in band gap energy can be performed in the form of an upwardly or downwardly curving line instead of a straight line. However, the most effective decrease in carrier concentration can be achieved by approximately linear increase in band gap energy. As mentioned above, a decrease in carrier concentration of the p-side optical guide layer enables a decrease in the probability of the non-radiative recombination, so that the configuration of the present invention contributes to remarkable improvement in internal quantum efficiency. The layer, in which the band energy increases approximately linearly is formed, by varying the composition of a compound semiconductor.

Referring carefully to a graph of FIG. 6, the carrier concentration of the present invention becomes slightly higher in the p-side optical guide layer near the well layers than the laser element of a conventional structure. The carrier concentration becomes higher as coming to a side of the electron barrier layer in the conventional structure; however, the carrier concentration does not increase but is almost constant in the laser element of the present embodiment. As a result, it is found that the carrier concentration of the p-side optical guide layer in the laser element of the present embodiment largely decreases compared with that of a conventional p-side optical guide layer. Such phenomenon becomes remarkable as the p-side optical guide layer becomes thicker. Especially, in the semiconductor laser element, it becomes necessary for the p-side optical guide layer to have sufficient thickness so as to improve optical confinement. Accordingly, large effect of the laser element of the present embodiment is exerted. The steeper the slope of the band energy becomes, the more an increase in carrier concentration can be suppressed.

Preferably, the composition graded layer of the p-side optical guide layer at least partially contains In.

The layer, that contains In and disposed in the above-mentioned position, functions as a strain buffer layer to the well layer. Accordingly, softness of the crystal containing In itself has the effect of dispersing strain of the well layer. Especially, it is considered that the In composition at a portion near the well layer is large because of composition gradient, and thus the buffer layer more effectively functions. It is also considered that the effect of suppressing piezoelectric polarization due to the layer having a large In composition is also exerted.

Preferably, the p-side optical guide layer has band energy lower than that of the electron barrier layer.

The reason is that an increase in operating voltage of the p-side optical guide layer is suppressed by the effect of stopping electrons by the electron barrier layer.

Preferably, the p-side optical guide layer has a film thickness of a range between 500 and 5,000 angstrom.

Preferably, the p-side optical guide layer is in contact with the final well layer and/or the electron barrier layer.

Employment of the structure enables, as mentioned above, a decrease in the probability of non-radiative recombination in the p-side optical guide layer and effective confinement of light.

Preferably, a composition graded layer of the p-side optical guide layer includes $Al_x In_y Ga_{1-x-y} N$ ($0 \le x < 1$, $0 \le y < 1$, $0 \le x+y < 1$).

Preferably, the composition graded layer of the p-side optical guide layer includes $In_x Ga_{1-x} N$ ($0 \le x < 1$). The composition graded layer can function as a strain buffer layer.

A barrier layer nearest to the n-type semiconductor layer of the barrier layers is a first barrier layer. Preferably, the first barrier layer has a film thickness larger than that of the well layer.

Preferably, the first barrier layer contains n-type impurity in the concentration of $1 \times 10^{19}$ cm$^{-3}$ or more. The first barrier layer has an effect of blocking overflow of the holes from the well layers and thus functions as a hole block layer. Laser characteristics of the semiconductor element can be improved by providing the layer. Since the first barrier layer functions as the hole block layer, the first barrier layer may have a structure that a thin film not containing the n-type impurity partially is inserted therein.

Preferably, the n-side optical guide layer is in contact with the first barrier layer and the contact surface in the n-side optical guide layer includes a non-doped region. In case the first barrier layer functions as the hole block layer, the n-side optical guide layer may be a non-doped region. As a result, an n-type impurity concentration and the carrier concentration in the n-side optical guide layer decrease, whereby a resulting decrease in the probability of non-radiative recombination and a resulting decrease in light absorption coefficient contribute to an improvement in semiconductor laser characteristics.

To obtain the effect of optical confinement due to the n-side optical guide layer, the n-side optical guide layer preferably has a film thickness larger than that of the first barrier layer. When the n-side optical guide layer is a non-doped region, if the n-side optical guide layer has a structure that, similar to the p-side optical guide layer, the band energy is decreased toward the well layer due to the composition gradient, abnormality occurs in a voltage characteristic due to an adverse influence of the piezoelectric field, thus causing an increase in voltage. Therefore, it is desired that the n-side optical guide layer is a layer of a non-doped region free from the composition gradient.

Preferably, the p-side optical guide layer is a non-doped layer. Doping induces an increase in carrier concentration, resulting in an increase in the probability of non-radiative recombination and the light absorption coefficient. Thus, drastic deterioration of laser characteristics may sometimes occur. However, the p-side optical guide layer may be a N-type semiconductor layer.

Preferably, a total film thickness of the well layers (sum of film thicknesses of all well layers) is larger than a total film thickness of other barrier layers excluding the first barrier layer. Such a structure can effectively suppress the piezoelectric field applied to the well layers, so that the probability of radiative recombination increases and also the operation voltage can be decreased.

In other words, film thicknesses of an intermediate barrier layers, i.e., a film thickness of each of the other barrier layers excluding the first barrier layer, is preferably as thin as possible. Especially, the film thickness of each intermediate barrier layer is preferably 60 Å or less.

Preferably, the p-side optical guide layer is in contact with the electron barrier layer.

A barrier layer of the at least one barrier layer (the one or more barrier layers) nearest to the n-type semiconductor layer is a first barrier layer. Preferably, the first barrier layer has a film thickness larger than that of the well layer. Such structure achieves sufficient carrier confinement. Especially, the structure is effective when the film thickness of each of the intermediate barrier layers disposed after the first barrier layer is thinner.

Preferably, the first barrier layer has a film thickness in a range between 20 and 200 angstrom. Each well layer may have a film thickness of 200 angstrom or less.

A structure of a nitride semiconductor laser element according to a second embodiment of the present invention will be described below. The nitride semiconductor laser element is a laser element having a single quantum well structure. The nitride semiconductor laser element includes an active layer between an n-type semiconductor layer and a p-type semiconductor layer. The n-type semiconductor layer includes an n-side optical guide layer. The active layer has a single quantum well structure in which a barrier layer and a well layer are disposed on the n-side optical guide layer in this order. The barrier layer has band gap energy higher than that of the n-side optical guide layer. The p-type semiconductor layer includes, on the well layer, a p-side optical guide layer and an electron barrier layer having band gap energy higher than that of the barrier layer in this order. The p-side optical guide layer includes a region (first region) that is disposed on a side of the well layer and has band gap energy lower than that of the n-side optical guide layer, and a region (second region) that is disposed on a side of the electron barrier layer and has band gap energy higher than that of the n-side optical guide layer.

Examples according to the present invention will be described in detail below. Needless to say, the present invention is not limited to the following Examples.

Example 1

A nitride semiconductor laser element structure will be described below as Example.

In the present Example, a c-surface GaN substrate was used as a substrate 10 for growing a nitride semiconductor layer. Inserted, an m-surface or a-surface nonpolar GaN substrate, a semipolar GaN substrate, a nitride substrate of AlN, and a different-type substrates that is different from the nitride semiconductor, may be used. Examples of the different-type substrate include an insulating substrate such as sapphire having any one of an R-surface or an A-surface as a main surface, SiC (including 6H, 4H, and 3C), ZnS, ZnO, GaAs, and Si. It is also possible to use a template substrate in which a nitride semiconductor is grown on a different-type substrate that is different from the nitride semiconductor. For example, a template substrate in which GaN is grown on W may be used. The substrate may be off-angled, and a substrate off-angled into a step shape is commonly used.

It is considered that particularly large effect can be exerted in the c-surface having a polar face in the present Example. In the element on the c-surface GaN substrate, electrons are likely to overflow from the well layer due to the piezoelectric field applied to the well layer. Increase in the carrier concentration of the p-side guide layer is likely to cause a decrease in internal quantum efficiency. In the present Example, since it is possible to suppress an increase in carrier concentration of the p-side guide layer, the probability of non-radiative recombination becomes smaller. As a result, large effect of improving internal quantum efficiency is exerted in the element on the c-surface GaN substrate.

A blue laser diode having an oscillation wavelength of 460 nm will be described below. The nitride semiconductor layer was produced by the metal organic chemical vapor deposition method (MOCVD method). Trymethylgallium (TMG), trimethylaluminum (TMA), trimethylindium (TMI), ammonia, silane gas and cyclopentadienylmagnesium (Cp2Mg) were appropriately used as materials.

On a c-surface GaN substrate 10, an n-type semiconductor layer 11 is grown. Specifically, aground layer made of Si-doped $Al_{0.02}Ga_{0.98}N$ was grown in a film thickness of 2.0 µm.

Next, a first n-side semiconductor layer made of Si-doped $In_{0.05}Ga_{0.95}N$ was grown in a film thickness of 0.15 µm.

Next, a layer made of Si-doped $Al_{0.07}Ga_{0.93}N$ was grown in a film thickness of 1.0 µm, and then a layer made of Si-doped GaN was grown in a film thickness of 0.3 µm. The layer thus formed is a second n-side semiconductor layer.

Next, a layer made of undoped $In_{0.03}Ga_{0.97}N$ was grown in a film thickness of 0.2 µm. This layer is an n-side optical guide layer.

Next, an active layer 12 was grown. A first barrier layer made of Si-doped GaN of about $2 \times 10^{19}$ cm$^{-3}$ was grown in a film thickness of 100 angstrom. This layer functions as a hole block layer. On the layer, a first well layer made of undoped $In_{0.15}Ga_{0.85}N$ in a thickness of 35 angstrom, an intermediate barrier layer made of undoped GaN in a thickness of 35 angstrom, and a second well layer made of undoped $In_{0.15}Ga_{0.85}N$ in a thickness of 35 angstrom were grown in this order. Then, a final barrier layer made of GaN was grown in a film thickness of 10 angstrom. Finally, the active layer has a multi-quantum well structure (MQW) having a total film thickness of about 115 angstrom. Similar to the present example, the final barrier layer may be introduced between the well layer and the p-side guide layer as long as an operating voltage does not increase. It is considered that this layer functions as a layer that suppresses decomposition of InGaN and improves flatness of a crystal of the well layer.

Next, a p-type semiconductor layer 13 was grown on the active layer 12. Specifically, a p-side optical guide layer made of $In_xGa_{1-x}N$ (0≤x<1) was grown. The p-side optical guide layer was grown as a composition graded layer. Specifically, the p-side optical guide layer was made of $In_{0.06}Ga_{0.94}N$ on a side of the well layer, and GaN on a side of the electron barrier layer, and the layer was grown in a total film thickness of 2,000 angstrom by decreasing the content of In such that composition gradient thereof becomes approximately linear.

Next, an electron barrier layer was grown. An electron barrier layer made of Mg-doped $Al_{0.16}Ga_{0.84}N$ using $Cp_2Mg$ was grown in a film thickness of 100 angstrom.

Next, a p-side clad layer was grown. Regarding the p-side clad layer, a layer made of undoped $Al_{0.04}Ga_{0.96}N$ in a film thickness of 1,500 angstrom and a layer made of Mg-doped $Al_{0.04}Ga_{0.96}N$ in a film thickness of 1,500 angstrom were grown in this order.

Next, a p-side contact layer was grown. A p-side contact layer made of Mg-doped p-type GaN was grown in a film thickness of 150 angstrom.

Next, a wafer grown with elements was taken out from an MOCVD furnace to form a stripe shaped ridge having a width of 30 μm by RIE. Then, a p-side electrode 15 made of ITO was formed on the ridge in a film thickness of 200 nm. Subsequently, an insulating film 16 made of $SiO_2$ was formed in a film thickness of 200 m. The insulating film covers an upper surface of the semiconductor layer and regions of side surfaces and an upper surface of the ridge 14 where no p-side electrode is formed (i.e., regions of both ends of the ridge).

Next, a pad 18 made of Ni (having a film thickness of 8 nm)/Pd (having a film thickness of 200 nm)/Au (having a film thickness of 800 nm)/Pt (having a film thickness of 200 nm)/Au (having a film thickness of 300 nm) was formed. Au having a film thickness of 300 nm as a final layer was alloyed with a AuSi eutectic alloy upon mounting the same with its face down.

After polishing a wafer having the above-mentioned configuration from a side of the substrate to thereby adjust a film thickness to 80 μm, an n-side electrode 19 made of Ti (having a film thickness of 6 nm)/Au (having a film thickness of 200 nm)/Pt (having a film thickness of 200 nm)/Au (having a film thickness of 300 nm) was formed on a lower surface of the substrate.

Next, the wafer was cleaved in the form of a bar along an M-surface as a cleavage plane to thereby form a plurality of bar-shaped wafers. After AlN was formed on a light emitting surface of each of thus obtained bar-shaped wafers, $SiO_2/Ta_2O_5$ was formed thereon as a light emitting side protective film (light emitting side mirror). After the AlN was formed on a reflection surface of the bar-shaped wafer, six pairs in total of $SiO_2/Ta_2O_5$ were formed thereon to form a reflection side protective film (reflection side mirror).

Next, each bar-shaped wafer was cut in a direction parallel to the ridge to obtain a semiconductor laser element having a cavity length (length in a direction parallel to the ridge) of 1200 μm and a width (length of the laser element in a direction vertical to the ridge) of 150 μm.

The nitride semiconductor laser element produced as mentioned above oscillated at 460 nm.

Figure 7:
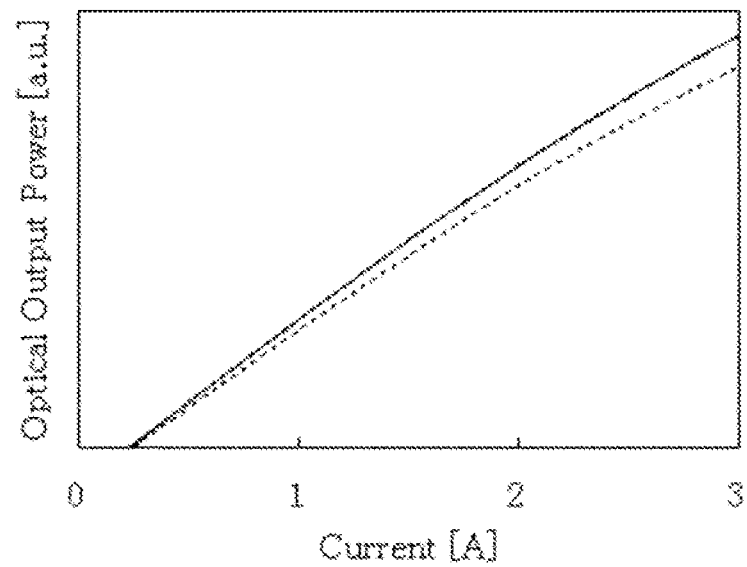
FIG. 7 is a schematic diagram illustrating I-L characteristics of a nitride semiconductor laser element according to an embodiment of the present invention and those of Comparative Example.
Figure 8:
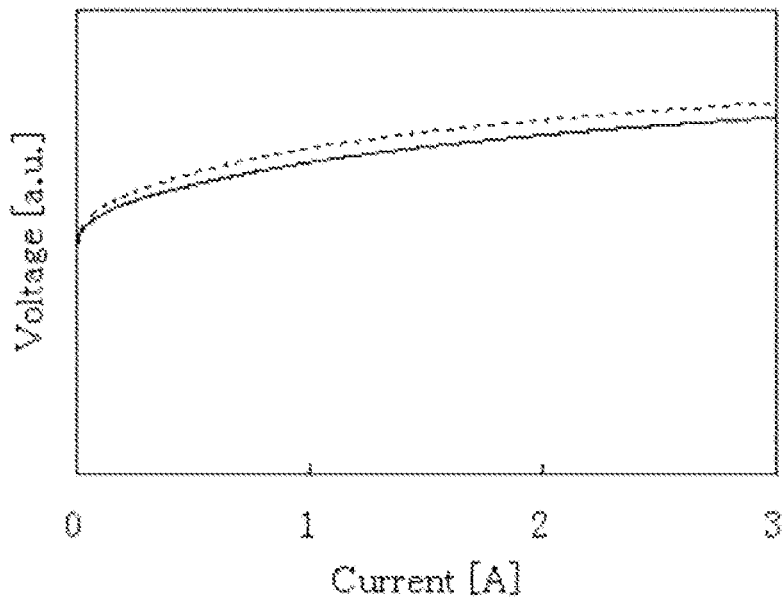
FIG. 8 is a schematic diagram illustrating I-V characteristics of a nitride semiconductor laser element according to an embodiment of the present invention and those of Comparative Example.

I-L characteristics and I-V characteristics of the laser elements produced in Example 1 are indicated by a solid line in FIG. 7 and FIG. 8, respectively. In Comparative Example 3, a laser element is produced so as to have the same structure as in Example 1, except that a p-side optical guide layer is formed as a single layer composed of $In_{0.03}Ga_{0.97}N$ in a film thickness of 2,000 angstrom, and I-L characteristics and I-V characteristics of the laser element of the Comparative Example 3 are indicated by a broken line in FIG. 7 and FIG. 8, respectively.

The results of Example 1 of the present invention revealed that an increase in slope efficiency causes an improvement in light output and a decrease in voltage as comparison with Comparative Example 3. The reason is considered that, as illustrated in FIG. 5 and FIG. 6, the effect of a decrease in probability of non-radiative recombination due to suppression of an increase in carrier concentration of the p-side guide layer is exerted and thus internal quantum efficiency improved, leading to an improvement in light output. The reason is also considered that a voltage was decreased by providing a layer having small band energy on the p-side guide layer on the side of the well layer.

Example 2

Example 2 relates to a laser element having an oscillation wavelength that is different from that of the laser element of Example 1. The laser element of Example 2 is a green laser having an oscillation wavelength of 515 nm. The laser element was produced in the same manner as in Example 1. A semiconductor layer was formed by growing a first well layer and a second well layer in a film thickness of 25 angstrom using undoped $In_{0.30}Ga_{0.70}N$. An intermediate barrier layer was formed by growing in a film thickness of 25 angstrom using undoped GaN. A p-side optical guide layer is made of $In_{0.08}Ga_{0.92}N$ on a side of the well layer, and GaN on a side of the electron barrier layer, and the layer was grown in a total film thickness of 2,000 angstrom by adjusting the content of In such that composition gradient thereof becomes approximately linear. Except for the above-mentioned structure, a laser element having the same structure as that of the laser element of Example 1 is produced. The ridge of the laser element has a width of 15 μm.

The laser element produced as mentioned above oscillated at 515 nm.

Figure 9:
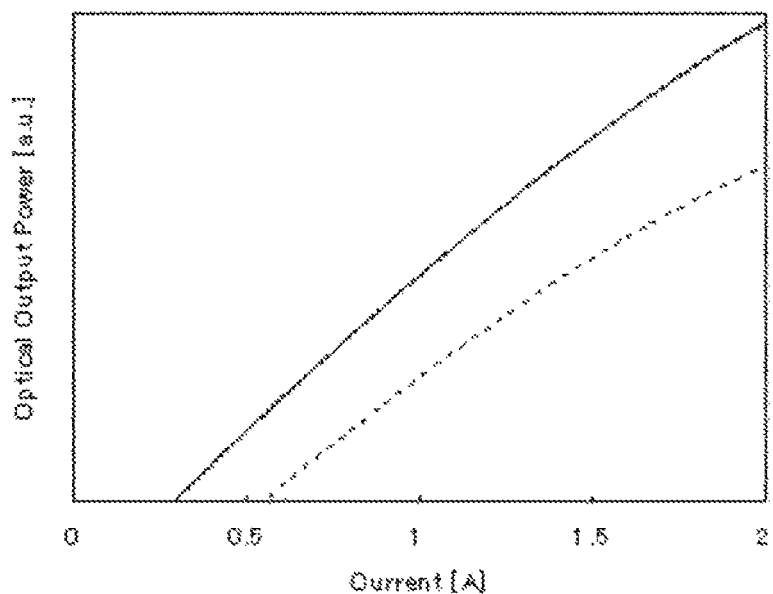
FIG. 9 is a schematic diagram illustrating I-L characteristics of a nitride semiconductor laser element according to an embodiment of the present invention and those of Comparative Example.
Figure 10:
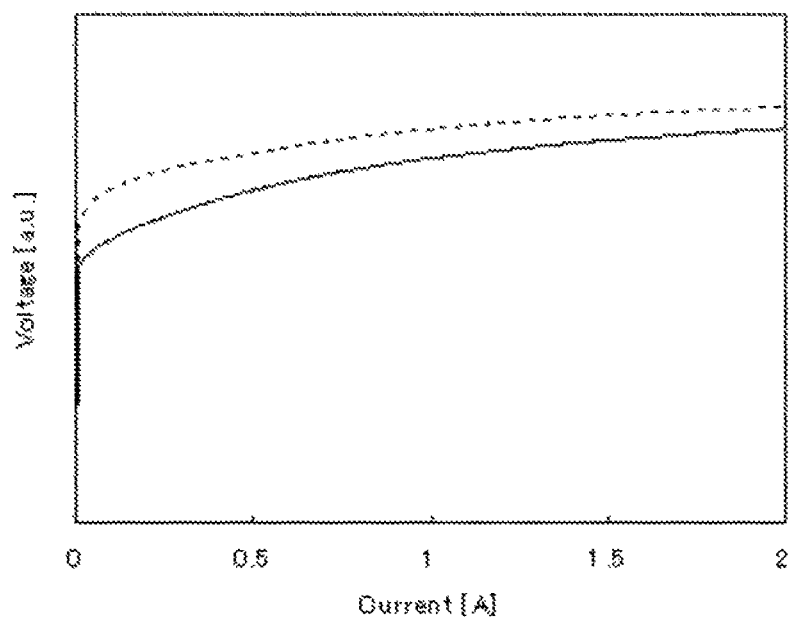
FIG. 10 is a schematic diagram illustrating I-V characteristics of a nitride semiconductor laser element according to an embodiment of the present invention and those of Comparative Example.

I-L characteristics and I-V characteristics of the laser element produced in Example 2 are indicated by a solid line in FIG. 9 and FIG. 10, respectively. In Comparative Example 4, a laser element was produced so as to have the same structure as in Example 1, except that an intermediate barrier layer of an active layer was formed as a single layer having a film thickness of 140 angstrom and a p-side optical guide layer made of $In_{0.03}Ga_{0.97}N$ was formed as a single layer having a film thickness of 2,000 angstrom, and I-L characteristics and I-V characteristics of the laser element are indicated by a broken line in FIG. 9 and FIG. 10, respectively.

In a comparison between Example 2 and Comparative Example 4, not only a remarkable improvement in light output due to increase of slope efficiency, but also a significant decrease in threshold current largely occurs. The difference in the threshold current was not so large in Example 1. In a green long wavelength region of the present Example, the well layer of a highly mixed In crystal must be grown. Therefore, not only large piezoelectric field is generated, but also large lattice strain occurs, thus causing deterioration of crystallinity. Therefore, in order to suppress the piezoelectric field and to maintain crystallinity, thinning of the well layer must be performed. However, carrier confinement becomes inferior and it causes more drastic overflow of the carrier from the well layer. For such reason, remarkable effect of suppressing an increase in carrier concentration of the p-side optical guide layer is exerted and internal quantum efficiency is significantly improved, thus realizing not only an improvement in slope efficiency but also a large decrease in threshold current. For the same reason as in Example 1, a voltage decreases in Example 2 as compared with Comparative Example 4. The reason is considered that the effect of a significant decrease in voltage is exerted since the film thickness of the intermediate barrier layer is smaller than that of the well layer. It is also considered that remarkable effect of increasing optical confinement to the well layer is exerted to thereby realize an improvement in characteristics, especially in a green long wavelength region.

The present application claims priority based on Japanese Patent Application No. 2012-259129, the entire disclosure of which is incorporated herein by reference.

The laser element according to the present invention can be used for, in addition to a light source for optical disk, a light source for displays such as a light source for projectors and a light source for televisions, a light source for medical purposes, and the like.

What is claimed is:

1. A nitride semiconductor laser element comprising:
   an n-type semiconductor layer comprising an n-side optical guide layer;
   a p-type semiconductor layer; and
   an active layer disposed between the n-type semiconductor layer and the p-type semiconductor layer, the active layer comprising two or more well layers, and at least one barrier layer disposed between the well layers,
   wherein the p-type semiconductor layer comprises an electron barrier layer having band gap energy higher than that of all barrier layers comprised in the active layer,
   wherein a p-side optical guide layer is disposed between a final well layer and the electron barrier layer, the final well layer being a well layer nearest to the p-type semiconductor layer of the two or more well layers,
   wherein the p-side optical guide layer comprises a composition graded layer of $Al_xIn_yGa_{1-x-y}N$ ($0 \leq x < 1$, $0 \leq y < 1$, $0 \leq x+y < 1$) having band gap energy increasing approximately linearly from a side of the final well layer to a side of the electron barrier layer, and
   wherein a region of the composition graded layer on a side of the final well layer has a lower band gap energy than that of the barrier layer.

2. The nitride semiconductor laser element according to claim 1, wherein the p-side optical guide layer comprises a composition graded layer of $In_yGa_{1-y}N$ ($0 \leq y < 1$).

3. The nitride semiconductor laser element according to claim 1, wherein the p-side optical guide layer is in contact with the electron barrier layer.

4. The nitride semiconductor laser element according to claim 1, wherein a barrier layer nearest to the n-type semiconductor layer of the barrier layers is a first barrier layer, and the first barrier layer has a thickness larger than that of each of the well layers.

5. The nitride semiconductor laser element according to claim 1, wherein the first barrier layer contains an n-type impurity in a concentration of $1 \times 10^{19}$ cm$^{-3}$ or more.

6. The nitride semiconductor laser element according to claim 1, wherein the p-side optical guide layer is a non-doped layer.

7. The nitride semiconductor laser element according to claim 1, the nitride semiconductor laser element is formed on a C-surface nitride substrate.

8. The nitride semiconductor laser element according to claim 1, wherein the p-side optical guide layer has a thickness in a range between 500 and 5,000 angstroms.

* * * * *